US008804766B2

(12) United States Patent
Ilan (10) Patent No.: US 8,804,766 B2
(45) Date of Patent: Aug. 12, 2014

(54) METHOD AND APPARATUS FOR COMPRESSING COMMUNICATION PACKETS

(71) Applicant: Dialogic Networks (Israel) Ltd., Petach Tikva (IL)

(72) Inventor: Amir Ilan, Hod-Hasharon (IL)

(73) Assignee: Dialogic Networks (Israel) Ltd., Petach Tikva (IL)

(*) Notice: Subject to any disclaimer, the term of this patent is extended or adjusted under 35 U.S.C. 154(b) by 83 days.

(21) Appl. No.: 13/678,794

(22) Filed: Nov. 16, 2012

(65) Prior Publication Data

US 2013/0128902 A1 May 23, 2013

Related U.S. Application Data (60) Provisional application No. 61/561,456, filed on Nov. 18, 2011.

(51) Int. Cl.
*H04L 29/06* (2006.01)
*H04J 3/24* (2006.01)
*H03M 7/30* (2006.01)
*H04L 12/70* (2013.01)

(52) U.S. Cl.
CPC ............. *H04L 29/0604* (2013.01); *H03M 7/30* (2013.01); *H04L 2012/5652* (2013.01)
USPC .......... 370/477; 370/474; 370/394; 370/392; 370/521; 370/252; 709/247; 375/240.01; 375/240.24; 375/240.25

(58) Field of Classification Search
None
See application file for complete search history.

(56) References Cited

U.S. PATENT DOCUMENTS

| | | | | |
|---|---|---|---|---|
| 6,577,254 B2 * | 6/2003 | Rasmussen | ...................... | 341/51 |
| 6,608,841 B1 * | 8/2003 | Koodli | ......................... | 370/474 |
| 6,791,982 B2 * | 9/2004 | Westberg | ...................... | 370/392 |
| 7,486,205 B2 * | 2/2009 | Wegener | ........................ | 341/50 |
| 8,107,525 B1 * | 1/2012 | Chan et al. | ................ | 375/240.01 |
| 8,223,797 B2 * | 7/2012 | Liang et al. | ................... | 370/474 |
| 8,340,129 B2 * | 12/2012 | Kim et al. | ..................... | 370/471 |
| 2002/0001315 A1 * | 1/2002 | Tran et al. | ..................... | 370/475 |
| 2002/0075857 A1 * | 6/2002 | LeBlanc | ........................ | 370/352 |
| 2005/0002453 A1 * | 1/2005 | Chang et al. | ................ | 375/240.03 |
| 2005/0047509 A1 * | 3/2005 | Lee et al. | ................ | 375/240.19 |
| 2006/0015650 A1 * | 1/2006 | Fallon | ........................... | 709/247 |
| 2007/0147366 A1 * | 6/2007 | Babbar et al. | ................. | 370/389 |

* cited by examiner

Primary Examiner — Candal Elpenord
(74) Attorney, Agent, or Firm — Chapin IP Law, LLC (57) ABSTRACT

The present invention is a method of sending compressed data includes providing a plurality of M compressing devices, each compressing device configured to apply a lossless compression algorithm and dividing uncompressed data into a first plurality of sequential segments S of uncompressed data. Each segment Si of a first N sequential segments of uncompressed data, for i=1 to N, where M >N, is applied to a respective compressing device CDi, and N respective compressed blocks Bi, each block Bi having a respective characteristic transmission time BlockDurationi.

29 Claims, 4 Drawing Sheets

METHOD AND APPARATUS FOR COMPRESSING COMMUNICATION PACKETS

CROSS REFERENCE TO RELATED APPLICATIONS

This application is a non-provisional application of U.S. Provisional Patent Application Ser. No. 61/561,456 filed Nov. 18, 2011, entitled "Method and Apparatus for Compressing Communication Packets."

STATEMENT REGARDING FEDERALLY SPONSORED RESEARCH OR DEVELOPMENT

—Not applicable—

FIELD OF THE INVENTION

The present application relates in general to telecommunication systems and methods for efficiently transmitting data in these systems and, more particularly, to systems and methods for transmitting signals compressed by applying a lossless algorithm.

BACKGROUND OF THE INVENTION

Digital networks now carry voice, facsimile, data and video signals. With the vast amount of data being exchanged, data compression is used in these networks to increase efficiency by transmitting the signals in a compressed form. The cost and time savings are significant and thus highly desirable, which in turn has resulted in a continual demand for improved data compression algorithms.

Data compression is a technique whereby a signal, e.g., computer data, that requires a certain number of bits, is represented or encoded, using fewer bits overall. The ratio between the number of bits required for representing the original signal versus the number of bits required by the encoded signal is generally known as the compression ratio. The complimentary process in which the compressed and encoded signal is expanded and reconstructed to form its original representation is generally known as either decompression, decoding or reconstruction.

Data compression is a technology which has matured over time and includes two types of compression: lossy and lossless. In a lossy compression system, portions of the data that are determined to be less necessary than others are discarded, making exact reconstruction or decompression of the signal impossible. Accordingly, lossy compression is usually employed, for example, in connection with physical signals such as speech, audio, images and video in which exact reconstruction of the original signal is usually not required for perceptive acceptability. Moreover, since these types of signals are generally destined for human perception, such as by the human auditory or visual senses, minor differences between the original and reconstructed signals may either be undetectable by human senses or the slightly degraded signal can be tolerated.

In contrast, lossless compression enables an exact reconstruction of the original signal performed upon decompression and can achieve a perfect recreation of the original signal without the degraded or compromised characteristics of lossy compression techniques. One of the consequences of employing lossless compression, however, is that the compression ratio, or the ability to compress a large number of data bits into a smaller number of data bits, is greatly reduced.

Despite this, for certain types of data information, it is imperative that perfect reconstruction of lossless data compression be employed rather than the compromised reconstruction approach characteristic of lossy compression techniques. For example, computer data such as an executable file must be precisely reconstructed, otherwise significant negative effects might occur.

At present, various entropic compression methods and pre-compression transformations exist. The existing lossless compression algorithms are typically categorized according to their approach to extract predictive information and/or repetitive patterns embedded in the signal, e.g., repetition of patterns, and the methods used to efficiently encode the information.

Typically, lossless compression algorithms encode the source information in a more compact and optimized way using global statistics and information.

While utilizing lossless compression techniques for communication purposes, optimized encoding is achieved by using information embedded in the previously transmitted data. However, the encoder and decoder must retain synchronization therebetween regarding the transmitted/received data used to encode/decode that data, in order for such applications to operate successfully.

As may be understood from the above, whenever a lossless compression operation is performed over traffic carried along a communication link (bearer), loss of information, e.g., packet loss in packet-switched networks is a hurdle that should be addressed because even if one bit has been lost, the synchronization between the two ends of the link would be lost and no meaningful decompression of the arriving traffic would be obtained.

An example of a conventional approach to addressing this situation is to adopt an error control mechanism for data transmission such as, for example, Automatic Repeat-reQuest (ARQ), over traffic conveyed along the communication link in order to make the link reliable. In accordance with ARQ, the information used for learning how to carry out the compression is only information known to be available at both ends of the link. One notable disadvantage of this approach, however, is that it dramatically increases the round-trip delay of the communication link, to an extent that it might even be impractical to implement it in certain communication applications.

Another conventional approach is to limit the significance of historical information, thereby limiting the impact of data loss.

Still another technique known in the art is to perform a reset of both ends of the link upon each interval of a predetermined period of time, without taking into account any existing conditions, e.g., that the two ends of the link currently operate properly. A major problem associated with this type of technique is that all information transmitted during the period that extends from after a certain loss of information until the next time a reset is carried out will be lost. The reset operation itself impairs the compression ratio and therefore should not be applied very frequently.

Another conventional approach is to separate the compression/encoding activity from the adaptation/learning activity. By doing so, the adaptation of the encoding scheme is done only on data that the receiving party has confirmed it has received. Unfortunately, this approach suffers from a high degree of complexity.

What is needed, therefore, is an approach that provides a lossless compression technique with a high compression ratio without the complexities and disadvantages of known or conventional approaches.

SUMMARY OF THE INVENTION

In accordance with one embodiment of the present invention, a method of sending compressed data includes providing a plurality of M compressing devices, each compressing device configured to apply a lossless compression algorithm and dividing uncompressed data into a first plurality of sequential segments S of uncompressed data. Each segment $S_i$ of a first N sequential segments of uncompressed data, for i=1 to N, where M>N, is applied to a respective compressing device $CD_i$, and N respective compressed blocks $B_i$, each block $B_i$ having a respective characteristic transmission time $BlockDuration_i$, are obtained where a sum of the characteristic transmission times $BlockDuration_i$ for i=1 to N, of said N blocks, is greater than a predetermined Response Time (RT). The blocks $B_i$ are sequentially forwarded along a communication link in an order i=1 to N. The response time (RT) is an amount of time taken to receive a message in response to the forwarding of a block $B_i$ along the communication link.

In accordance with another embodiment of the present invention, a method of sending compressed data along a communication link in a communications network, includes receiving uncompressed data at a first end of the communication link; and providing a plurality of compressing devices at the first end of the communication link, each compressing device configured to apply a lossless compression algorithm. The received uncompressed data is divided into a first plurality of sequential segments S of uncompressed data. Data in each segment $S_i$ of a first N sequential segments of uncompressed data, for i=1 to N, from the first plurality of sequential segments, is compressed by applying the data in each segment $S_i$ to a respective compressing device $CD_i$, and obtaining N respective compressed blocks $B_i$, each block $B_i$ including at least one packet and each block $B_i$ having a respective characteristic transmission time of $BlockDuration_i$. The number (N) is equal to or less than the number of the plurality of compressing devices provided; and a sum of the aggregated characteristic transmission times $BlockDuration_i$, for i=1 to N, of said N blocks, is greater than a predetermined Response Time (RT), as expressed in the following mathematical relationship:

$$\sum_{i=1}^{N} BlockDuration_i > RT$$

The obtained blocks $B_i$ are sequentially forwarded along the communication link, wherein the blocks are forwarded sequentially in an order i=1 to N from their respective compressing devices $CD_i$. The response time (RT) is an amount of time starting from when a packet of a block is sent from the first end of the communication link to when a message in response to the packet is received at that first end back from an other end of the communication link.

In accordance with yet another exemplary aspect, upon detecting at the other (second) end of the communication link that a packet has not been properly received thereat, resetting the decompressing device assigned to process the currently received compressed data block $B_i$, and generating at that second end at least one message to be forwarded to the first end of the communication link, wherein the at least one message provides an indication regarding a compressing device located at the first end which should be reset, thereby maintaining synchronization with its peer decompressing device. In further accordance with this yet another exemplary aspect, the compressing device that should be reset is the one which had forwarded the packet, associated with the compressed data block $B_i$, that has not been properly received.

According to still an additional exemplary aspect, N (the number of blocks) to be forwarded is less than M (the number of the plurality of compressing devices), wherein the method provided further comprises a step of activating one of the currently non-active compressing devices whenever one of the compressing devices which is currently operative to compress and forward traffic along the communication link is required to be reset (irrespective of the reason for the required reset), so that the next block that would have otherwise been forwarded by the compressing device that is required to be reset, will be compressed and forwarded by the newly activated compressing device.

BRIEF DESCRIPTION OF THE SEVERAL VIEWS OF THE DRAWINGS

Embodiments of the present invention may be better understood by referring to the following description in conjunction with the accompanying drawings in which.

DETAILED DESCRIPTION OF THE INVENTION

This application is a non-provisional application of U.S. Provisional Patent Application Ser. No. 61/561,456 filed Nov. 18, 2011, entitled "Method and Apparatus for Compressing Communication Packets," the entire contents of which is hereby incorporated by reference for all purposes.

Figure 1:
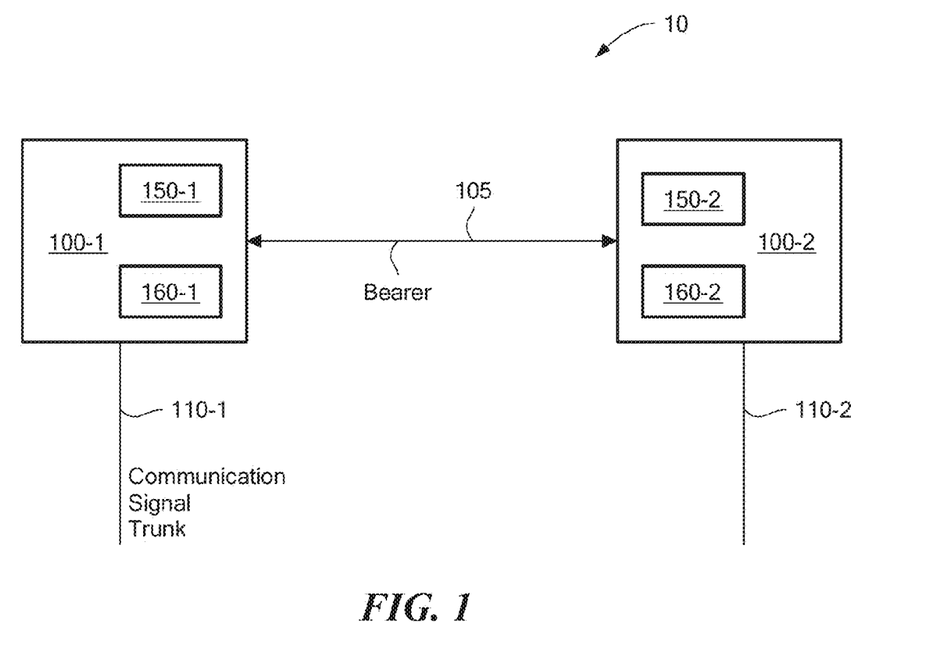
FIG. 1 is block diagram of a system in accordance with an embodiment of the present invention.

Embodiments of the present invention may be implemented in a communications network 10, referring to FIG. 1, including first and second communication apparatus 100-1, 100-2 connected to one another by a bearer channel 105, e.g., a packet switched transmission network. Each communication apparatus 100-1, 100-2 includes a respective set of compressing and decompressing sections (150-1, 160-1), (150-2, 160-2). Thus, for example, the compressing section 150-1 of the first communication apparatus 100-1 transmits to the decompressing section 160-2 of the second communication apparatus 100-2, and vice versa, as will be described below in more detail.

The bearer channel 105 is, generally, a bi-directional, non-reliable communication link with very low complexity and high flexibility. One of ordinary skill in the art will understand the different types of bearer channels that may be used and the embodiments of the present invention described herein are not limited to any specific type. It should be noted that only two communication apparatus 100-1, 100-2 are shown for ease of explanation and the network 10 is not limited in the number that can be implemented.

In addition, each of the first and second communication apparatus 100-1, 100-2 is connected to a respective bidirectional communication signal trunk 110-1, 110-2.

Figure 2:
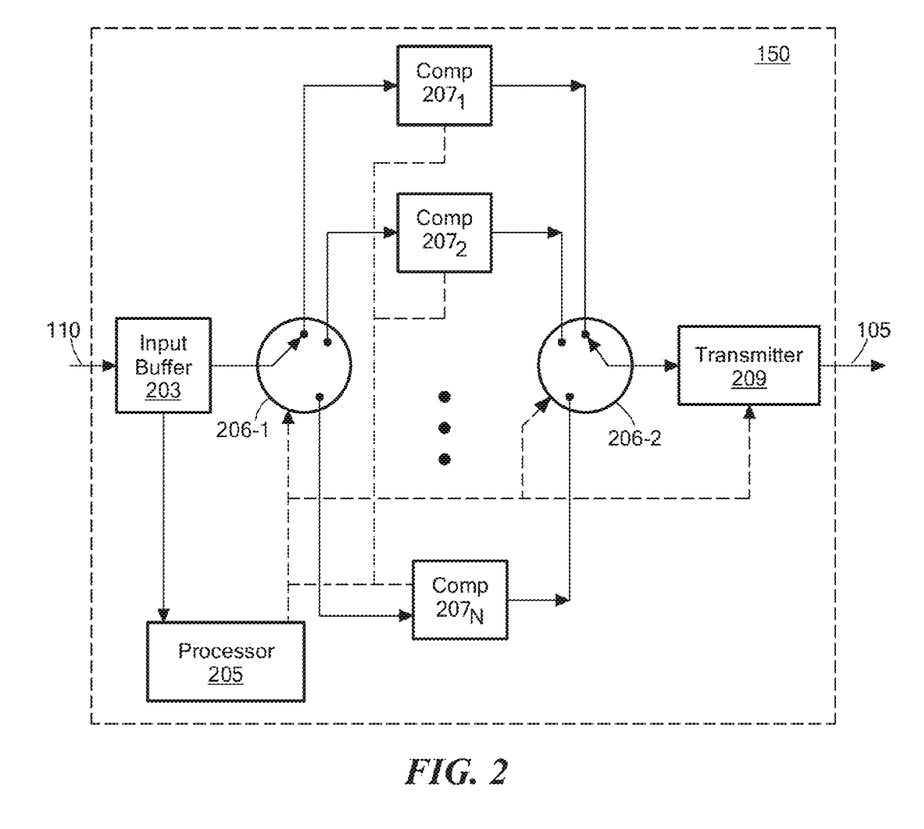
FIG. 2 is a block diagram of a compressing section in accordance with an embodiment of the present invention.

Referring to FIG. 2, each compressing section 150-$x$ includes an input buffer 203 coupled to the communication signal trunk 110-$x$ and a processor 205 coupled to the input buffer 203. A selectable switch 206-1 is coupled to an output of the input buffer 203 and controlled by the processor 205.

Each output of the switch 206-1 is coupled to a respective compressing device $207_i$. Another selectable switch 206-2 has its multiple inputs coupled, respectively, to the outputs of the compressing devices $207_i$ and is also controlled by the processor 205. A transmitter 209, also controlled by the processor 205, has its input coupled to the output of the switch 206-2 and an output of the transmitter 209 is coupled to the bearer channel 105. The compressing devices $207_i$ are also controlled by the processor 205.

Figure 3:
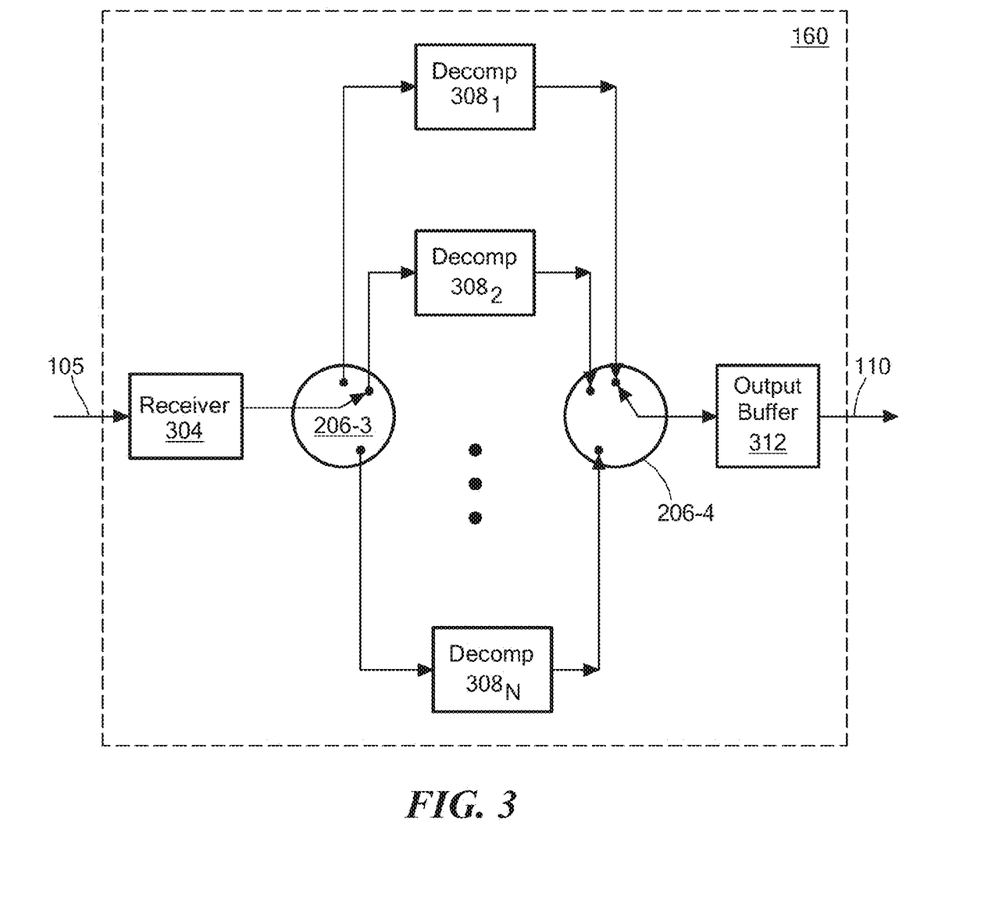
FIG. 3 is a block diagram of a decompressing section in accordance with an embodiment of the present invention.

While the processor 205 is shown as a single block, it should be understood that the processor 205 includes a CPU, memory, e.g., ROM and RAM, storage device, I/O device, and associated software, configured to implement the various embodiments of the present invention as described herein. As shown in FIG. 3, each decompressing section 160-$x$ includes a receiver 304 having an input coupled to the bearer channel 105. A selectable switch 206-3, controlled by the processor 205, wherein the transmitter 209 and the receiver 304 relay control information over the bearer channel 105, has its input coupled to an output of the receiver 304. Each output of the switch 206-3 is coupled to a respective decompressing device $308_i$, controlled according to information embedded in the traffic received from the bearer, in synchronization with remote peer compressing devices. Another selectable switch 206-4, controlled similarly to switch 206-3, has its multiple inputs coupled, respectively, to the outputs of the decompressing devices $308_i$. An output buffer 312 has an input coupled to the output of the switch 206-4 and an output coupled to a communication signal trunk 110-$x$.

In operation, according to an embodiment of the present invention, data in a lossless compressed form is transmitted over non-reliable communication links, with very low complexity and high flexibility, by utilizing the plurality of compressing devices $207_i$, in an interleaved fashion as will be discussed in more detail below.

As an illustrative example, assuming that a communication signal, e.g., non-compressed data, or any other form applicable for such a communication signal, arrives over the communication signal trunk 110 at the input buffer 203 of the communication apparatus 100-1. In order to save bandwidth resources within the network, it is desirable to compress the received communication signal, if possible, before having it conveyed along the bearer channel 105, which is a non-reliable communication link, to the next communication apparatus 100-2.

The received communication signal is forwarded from the input buffer 203 to the processor 205, which is configured to divide the communication signal into a plurality of segments S. Each of the divided segments is then forwarded to a respective one of the corresponding compressing devices $207_i$ that is/are available, i.e., being available because it has been reset and is available for processing non-compressed data, by the processor 205 controlling the selectable switch 206-1. In accordance with this embodiment, it is assumed that each of the plurality of compressing devices $207_i$ is consecutively numbered, i.e., i=1 to N.

The data contained in each segment $S_i$ is compressed and arranged into one or more packets composing a compressed data block $B_i$ that corresponds to that segment $S_i$, where the compression of the data is carried out by applying a lossless compression algorithm implemented in the respective compressing device $207_i$. It should be noted that in the current specification, any reference to "compressed data block $B_i$," "data block $B_i$," "block $B_i$," "block," etc., is a reference to the compressed data from the compressing devices.

Advantageously, embodiments of the present invention reduce the effects of information loss on the bearer channel 105. As described herein, the loss of a single packet on the bearer channel 105, associated with a certain compressed data block $B_i$, will break the synchronization between the compressing device and its peer decompressing device, thus preventing the decompression of the compressed data from that point until the end of the block $B_i$ and its respective segment $S_i$, where synchronization will be renewed by applying a synchronized reset. Accordingly, the effects of information loss are limited only to a specific block $B_i$.

Therefore, to comply with a predefined required maximum information loss propagation time, a maximum segment size, Max_Segment_Size [Bytes], is set to be less than or equal to the maximum information loss propagation time. For a given RTD (Round Trip Delay) of the bearer communication channel 105, the number of compressing and decompressing devices N, given a predefined trunk bandwidth, Trunk_BW [Bytes/Second], should satisfy the following equation:

$$N >= \text{RTD} * \text{Trunk\_BW} / \text{Max\_Segment\_Size}$$

The sizes of the segments S are selected by the processor 205 in order to limit the size of the compressed blocks $B_i$ but not exceeding the Max_Segment_Size. The number of packets in each compressed data block, may vary from one compressed data block to the other wherein the packet size depends, among other things, on the bandwidth available for conveying the packets along the bearer channel 105 and satisfying the maximum delay permitted on the communication path.

Each of these compressed data blocks $B_i$ has its own characteristic duration (BlockDuration$_i$), which is defined herein as the number of bytes contained in a compressed data block $B_i$ divided by the bandwidth (bytes/second) of the bearer channel 105, or, in other words, the time that would be required for the bearer channel 105 to convey the information within a compressed data block $B_i$.

The processor 205 is configured such that the first N segments of the arriving communication signal S are forwarded to corresponding N operative compressing devices $207_i$ available to generate N respective compressed blocks $B_i$ therefrom. The blocks $B_i$ are then forwarded from their respective compressing devices $207_i$, via operation of the switch 206-2 by the processor 205, to transmitter 209, which, in turn, forwards them along the bearer channel 105 toward the decompressing section 160-2 that corresponds to communication apparatus 100-2, but is located at the other end of the bearer channel 105.

The N compressed blocks satisfy the following mathematical relationship:

$$\sum_{i=1}^{N} BlockDuration_i > \text{Round Trip Delay}. \quad \text{(Equation 1)}$$

Generally, each transmission of a block $B_i$, or the packets making up the block $B_i$, is not complete until there has been either an acknowledgement (ACK) of successful full receipt or an indication that it was not fully received (NACK). The "Round Trip Delay" (RTD) is, therefore, the period of time starting from the transmission of a block $B_i$ from, for example, the compressing device $207_i$ until either an ACK or NACK message is received wherein the returned message has been generated in response to full receipt (or non-full-receipt) of that block $B_i$ at the other communication device 100-2 located at the other end of the bearer channel 105. Generally, but not necessarily, this period of time relates to the packet having the longest round trip delay from among all packets included in the plurality of blocks.

In one embodiment of the present invention, the processor 205 is able to monitor the size of a block $B_i$ as it is compressing data and once the corresponding BlockDuration$_i$ has been obtained, then the next block $B_{i+1}$ is created.

For example, if the incoming data on the signal trunk 110 arrives as one or more "frames" or "portions" that are smaller than a segment of data, then each incoming frame or portion is submitted to the compressing device 207$_i$, rendering a corresponding "compressed" data "portion." As a result, the segment is compressed by operation on smaller portions and the size of each is known by the processor 205.

Thus, grouping compressed data into packets and blocks B would consist of:
i. For a required BlockDuration [Seconds], for a given bearer link bandwidth,
Bearer_BW [Bytes/Sec], define a Max_block_size [Bytes] threshold as:

Max_block_size=BlockDuration*Bearer_BW

This is a threshold for determining when a block of "compressed" data has achieved the required size and therefore the present segment (of "uncompressed" data) may be closed and a new segment initiated.
ii. For a predefined maximum value of permitted packet transmission delay, Max_Transmission_Delay [Seconds], over the bearer channel, derive a maximum transmission unit, MTU [Bytes], according to the bearer bandwidth, Bearer_BW [Bytes/Seconds]:

MTU=Bearer_BW*Max_Transmission_Delay iii. Define a maximum permitted accumulation delay, Max_Acc_Delay [seconds], wherein the accumulation delay is the amount of time elapsed since a portion of data arrives to the input buffer 203 until it is compressed by a compression device 207$_i$ and transmitted by transmitter 209 as part of a bearer packet.
iv. Initialize a new $B_{(i+1)}$ block and its corresponding new segment $S_{(i+1)}$:
  a. Zero the accumulative size counter of the compressed data block.
  b. Associate a new segment and a corresponding new block with the next (n+1)$^{th}$ compressing device.
v. While a block's accumulative size counter is smaller than the predefined Max_block_size threshold, repeat the following steps:
  a. Compress incoming uncompressed data portions using the (n+1)$^{th}$ compressing device.
  b. Accumulate the respective compressed data portion from the output of the (n+1)$^{th}$ compressing device into a compressed data packet
  c. Upon achieving the MTU criteria predefined in (ii) or the Max_Acc_Delay criteria predefined in (iii), transmit the currently accumulated compressed data packet on the bearer channel 105.
  d. Associate the transmitted compressed data packet with the current compressed data block and increment the block's accumulative size counter by the size of the last transmitted compressed packet.
vi. Repeat from (iv).

In another embodiment of the present invention, it is assumed that the system implementation is synchronous where processing and transmission are scheduled to occur at constant or predetermined time intervals, $t_{si}$, e.g., every 1 mSec. Considering the compressor side, when a scheduling point is triggered, all incoming non-compressed data that have arrived during the last scheduling interval at the input buffer is submitted to the compressing device. The compressed data, formed into a packet, is then transmitted onto the bearer channel 105. Since the bearer packets are transmitted at known time intervals, $t_{si}$, the scheduling intervals are counted until an accumulated duration achieves the required Block Duration and then the next block and respective segment are initiated.

It should be noted that under this type of implementation, segment duration and block duration are, inherently, substantially equal, complying with delay constraints by preventing accumulation of data along the transmission path.

The packets and/or compressed blocks are enumerated in a way that the receiving side can detect a loss of a packet (or loss of a number of packets) or of a block $B_i$. Whenever the receiving side detects a loss of a packet, a reset request message will be sent to the transmitting side requesting a reset of the compressing devices 207$_i$.

In accordance with an embodiment of the present invention, a method of enumerating packets in order to detect packet loss and identify the Block impacted by packet loss adds a Byte Counter value to a header of each packet. The Byte Counter value tracks the amount of compressed data bytes transmitted over the bearer channel since the synchronized initialization of both the transmitter and the receiver has been performed. The Byte Counter value can be used to detect lost packets. Furthermore, the receiving side can use the Byte Counter value to derive a Block index associated with the lost packets since the algorithm used by the processor 205 to group compressed data into packets and Blocks is known and can be tracked by the receiver. The Byte Counter value can be used to determine if a reset of the compressing and decompressing devices associated with a Block is necessary.

The information in lost packets, however, is not re-sent or recovered. It is assumed that a reliable transmission protocol, e.g., TCP and the like, may be applied by the application, whenever it is required.

Advantageously, embodiments of the present invention control the propagation of information loss, as the information loss is limited to the specific block where a packet has been lost, while maintaining an unimpaired compression ratio since the reset operation impacts only a single pair of compressing/decompressing devices without affecting other devices. This is advantageous as, typically, a reset operation on a lossless compressing device substantially impairs the compression ratio until the database, i.e., the history buffer, is built.

After sending this reset request message, the next time the decompressing device 308$_i$, i.e., the receiving end of the link, is operated, it will reset itself prior to performing any further decompressing operation, assuming that the corresponding compressing device 207$_i$ of the sending communication apparatus has also been reset.

As set forth in Equation 1 above, the selection of the N segments ensures the correct functioning of the interleaved compressors because, if one of the blocks $B_i$ conveyed to the other end of the link has not been properly received, e.g., due to a packet being missing, the receiving side will send a message notifying the first end of the link that the packet is missing.

The period of time that would elapse from sending the block $B_i$ from the first end by a compressing device 207$_i$ until the message that has been sent from the receiving end arrives at the first end of the link may be greater than the Round Trip Delay (RTD) described above. For example, the total amount of time could include overhead time such as a detection time τ which is the time between packets, i.e., the gaps, where a loss of a packet is detected just after receiving the next packet. Once the compressing device $207_i$ forwards a block $B_i$ to the receiving end, it will not forward another (the next) block $B_{i+N}$ if it is not clear whether or not there is a problem with the last block $B_i$ that has been forwarded. Therefore, it should not forward the next block $B_{i+N}$ before a total period of time that includes the processing and detection overhead, i.e., RTD+τ has elapsed.

In order to effectively utilize the available bandwidth of the bearer channel 105, however, it would be desirable that all of the other compressing devices 207, transmit their respective blocks $B_i$ one after the other within a time period that is greater than the RTD and the overhead processing and detection time τ, such that when it is the turn for each compressing device $207_i$ to transmit its next block $B_{i+N}$, the period RTD +T has already expired, and the communication apparatus 100-1 is aware whether a message of a loss of a packet (NACK) associated with the block $B_i$ that had been forwarded by compressing device $207_i$, has been received, in which case compressing device $207_i$ will be reset.

Thus, the segment selection could be based on a modified version of Equation 1, as follows:

$$\sum_{i=1}^{N} BlockDuration_i > (RTD + \tau), \quad \text{Equation 2}$$

wherein τ is equal to the period of time required by the receiving end to detect a loss of a packet conveyed along the communication link by the respective compressing device. In another embodiment τ is equal to the period of time required: a) to detect a loss of a packet conveyed along the communication link, b) to send a message to the first end of the link indicating that such a loss has been detected and c) to restore the availability of the compressing device after reset.

Another option for a case of synchronous operation and transmission, i.e., where every packet is processed and transmitted at a predetermined time complying with a predefined accumulation delay, e.g., a packet is transmitted every 1 msec, is that τ is equal to or greater than the maximum allowed accumulation delay.

Figure 4:
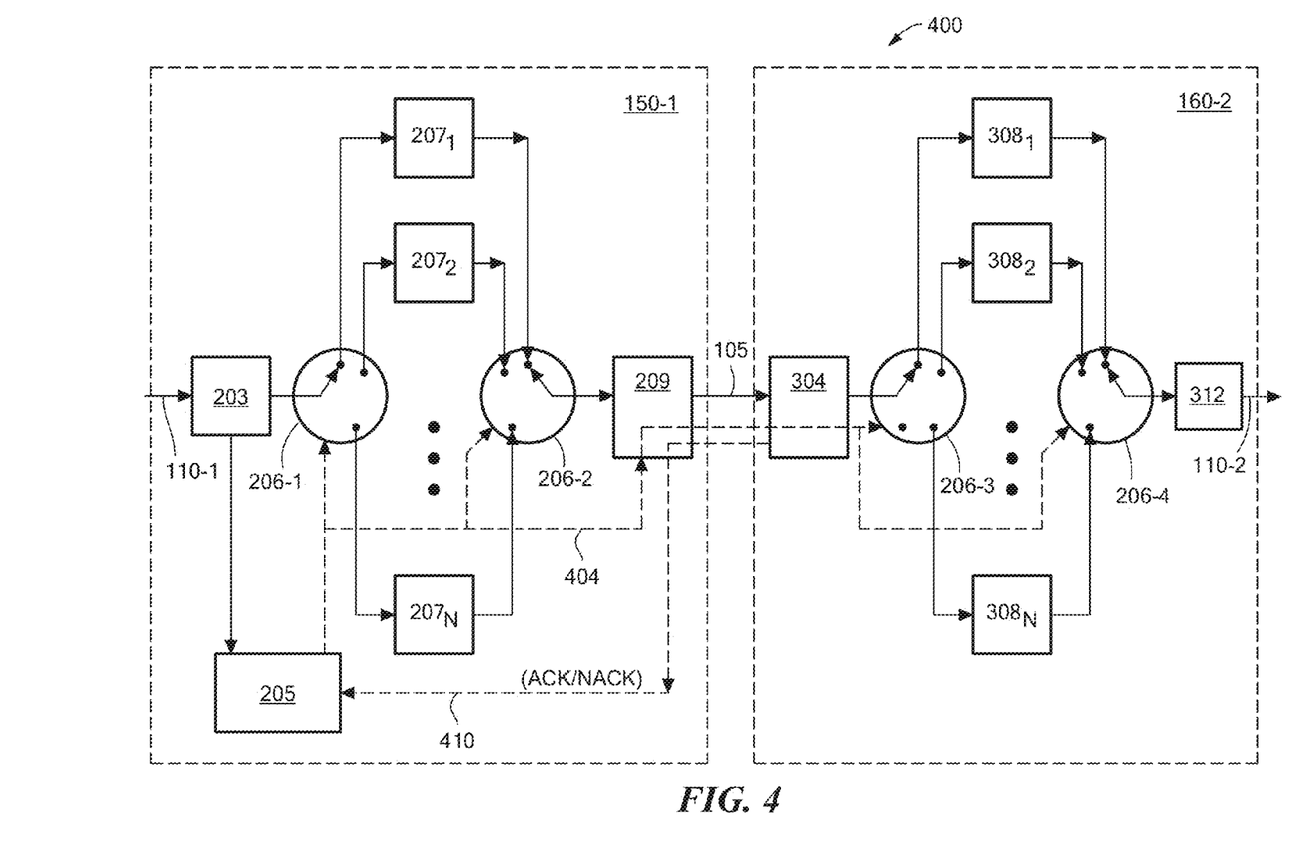
FIG. 4 is a detailed block diagram of a system in accordance with an embodiment of the present invention.

An "end-to-end" system 400 of a compressing section 150-1 coupled to a decompressing section 160-2 is presented in FIG. 4. It should be noted that, for reasons of simplicity, and to aid in understanding, however, some of the interconnections in each section are not shown. Thus, a path from the incoming communication signal trunk 110-1, through the compressing section 150-1, the bearer channel 105, the decompressing section 160-2 and to the outgoing communication signal trunk 110-2 is presented. In one embodiment of the present invention, the processor 205 maintains a control path 404 that controls operation of the selectable switches 206-1, 206-2, 206-3 and 206-4 across the bearer channel 105. In addition, an ACK/NACK signaling path 410, relative to the discussion above, is shown.

According to another embodiment of the present invention, a number M of compressing devices may be present in the system where M>N and those compressing devices that are not being used are in an inactive state. A method is provided that activates one of the currently non-active compressing devices whenever one of the currently operative compressing devices has to be reset (irrespective of the reason for the required reset), so that the next segment that would have otherwise been compressed by the reset compressing device will be compressed and forwarded by the newly activated compressing device.

A compressing device's database, used for compression/decompression, may be very large, on the order of gigabytes or even terabytes, and the initialization process may take a substantial amount of time. Advantageously, by having spare compressing devices that are inactive, but pre-initialized, i.e., in a standby mode, until needed provides an almost instantaneous allocation of an already initialized compressing device to replace a compressing device that needs to be reset and can be up and running without significant lag time.

Although the above disclosure has been described in a way that the communication link (the bearer) extends in a packet switched network, it should be understood that the present application is not restricted to such a configuration, and may be applied to other networks as well e.g., TDM networks, with the necessary modifications.

It is to be understood that the present application has been described using non-limiting detailed descriptions of embodiments thereof that are provided by way of example and are not intended to limit the scope of the disclosure. It should be understood that features and/or steps described with respect to one embodiment may be used with other embodiments, and that not all embodiments of the present application have all of the features and/or steps shown in a particular figure or described with respect to one of the embodiments.

It should be noted that some of the above described embodiments include structure, acts, and/or details of structures and/or acts that may not be essential to the present application, and that are described as examples. Structure and/or acts described herein are replaceable by equivalents which perform the same function, even if the structure and/or acts are different, as known in the art, e.g., the use of a processor to carry out at least some of the functions described as being carried out by the compressors of the present application.

In addition, the representation of a function as being implemented within a single block, as shown in a figure, does not limit embodiments of the present invention to such a structure. For example, and not intended to be limiting, the sub-functions described above in either the transmitter or receiver may each be performed in a separate component or device where, together, they implement the transmitter or receiver.

Still further, the functions of the compressing devices and the switches could be implemented on a same CPU with corresponding memory, i.e., each block may, therefore, be considered a representations of functions performed by software objects and/or modules. As a result, the "processor" may also be considered a label given to a "control" block or function.

When used in the appended claims, the terms "comprise," "include," "have," and their conjugates mean "including but not limited to."

It will be appreciated by those skilled in the art that modifications to and variations of the above-described apparatus and methods may be made without departing from the inventive concepts disclosed herein. Accordingly, the disclosure should not be viewed as limited except as by the scope and spirit of the appended claims.

What is claimed is:

1. A method of sending compressed data, the method comprising: (i) receiving sequential uncompressed data; (ii) providing a plurality of M compressing devices CD.sub.x, each compressing device CD.sub.x configured to apply a lossless compression algorithm and generate a corresponding compressed block B.sub.x; (iii) providing N compressing devices CD.sub.i for i=1 to N, where N.ltoreq..rarw.M, from the plurality of M compressing devices; (iv) for i=1 to N: continually applying the received sequential uncompressed data to a compressing device CD.sub.i until the corresponding compressed block B.sub.i has a corresponding transmission time duration BlockDuration.sub.i that is greater than or equal to a predetermined duration threshold value; and forwarding the obtained block B.sub.i along a communication link; and (v) repeating step (iv), wherein a sum of characteristic transmission times BlockDuration.sub.i for i=1 to N, is greater than a predetermined Response Time (RT), and wherein the Response Time (RT) is an amount of time taken to receive a message in response to the forwarding of a block B.sub.i along the communication link.

2. The method of claim 1, further comprising:
  determining the predetermined duration threshold value as a function of a bandwidth of a path on which the uncompressed data is received.

3. The method of claim 1, further comprising:
  determining the predetermined duration threshold value as a function of a bandwidth of the communication link on which the obtained blocks $B_i$ are forwarded.

4. The method of claim 1, wherein the compressed block B.sub.i comprises at least one packet and each packet includes an indication that would allow an other end of the communication link to determine whether one or more packets have not properly arrived.

5. The method of claim 4, wherein the response time (RT) comprises a processing time $\tau$ equal to a period of time required by the other end of the communication link to determine the loss of a packet conveyed along the communication link.

6. A method of sending compressed data, the method comprising: (i) receiving uncompressed data; (ii) providing a plurality of M compressing devices, each compressing device configured to apply a lossless compression algorithm; (iii) dividing the received uncompressed data into a first plurality of sequential segments S of uncompressed data; (iv) applying data in each segment S.sub.i of a first N sequential segments of the uncompressed data, for i=1 to N, where N.ltoreq.M, to a respective compressing device CD.sub.i, and obtaining N respective compressed blocks B.sub.i, each block B.sub.i having a respective characteristic transmission time BlockDuration.sub.i wherein a sum of characteristic transmission times BlockDuration.sub.i, for i=1 to N, of said N blocks, is greater than a predetermined Response Time (RT); (v) sequentially forwarding the obtained blocks B.sub.i along a communication link in an order i=1 to N; and (vi) repeating steps (iv) and (v) for another group of N sequential segments of the uncompressed data, wherein the response time (RT) is an amount of time taken to receive a message in response to the forwarding of a block B.sub.i along the communication link.

7. The method of claim 6, wherein step (iii) comprises:
  determining a maximum size of each segment $S_i$ as a function of a bandwidth of a path on which the uncompressed data is received.

8. The method of claim 6, wherein step (iii) comprises:
  determining a maximum size of each segment $S_i$ as a function of a bandwidth of the communication link on which the obtained blocks $B_i$ are forwarded.

9. The method of claim 6, wherein a block $B_i$ comprises at least one packet and each packet includes an indication that would allow an other end of the communication link to determine whether one or more packets have not properly arrived.

10. The method of claim 9, wherein the response time (RT) comprises a processing time $\tau$ equal to a period of time required by the other end of the communication link to determine the loss of a packet conveyed along the communication link.

11. The method of claim 6, further comprising:
  receiving at least one message comprising an indication of a specific compressing device $CD_i$ that should be reset;
  activating a currently non-active compressing device, where N<M; and
  compressing a next segment that would have otherwise been processed by the compressing device that has to be reset with the newly activated compressing device.

12. A method of sending compressed data along a communication link in a communications network, the method comprising:
  (i) receiving uncompressed data at a first end of the communication link;
  (ii) providing a plurality of compressing devices at the first end of the communication link, each compressing device configured to apply a lossless compression algorithm;
  (iii) dividing the received uncompressed data into a first plurality of sequential segments S of uncompressed data;
  (iv) compressing data in each segment $S_i$ of a first N sequential segments of uncompressed data, for i=1 to N, from the first plurality of sequential segments, by applying the data in each segment $S_i$ to a respective compressing device $CD_i$, and obtaining N respective compressed blocks $B_i$, each block $B_i$ including at least one packet and each block $B_i$ having a respective characteristic transmission time of $BlockDuration_i$, wherein:
    (a) the number (N) is equal to or less than the number of the plurality of compressing devices provided; and
    (b) a sum of aggregated characteristic transmission times $BlockDuration_i$, for i=1 to N, of said N blocks, is greater than a predetermined Response Time (RT), as expressed in the following mathematical relationship:

$$\sum_{i=1}^{N} BlockDuration_i > RT$$

(v) sequentially forwarding the obtained blocks $B_i$ along the communication link, wherein s the blocks are forwarded sequentially in an order i=1 to N from their respective compressing devices $CD_i$; and
  (vi) repeating steps (iv) and (v) for another group of N sequential segments of uncompressed data,
  wherein the response time (RT) is an amount of time starting from when a packet of a block is sent from the first end of the communication link to when a message in response to the packet is received at that first end back from an other end of the communication link.

13. The method of claim 12, wherein step (iii) comprises:
  determining a maximum size of each segment $S_i$ as a function of a bandwidth of a path on is which the uncompressed data is received.

14. The method of claim 12, wherein step (iii) comprises:
  determining a maximum size of each segment $S_i$ as a function of a bandwidth of the communication link on which the obtained blocks $B_i$ are forwarded.

15. The method of claim 12, wherein each of the packets included in a block $B_i$ includes an indication that would allow the other end of the communication link to detect whether one or more packets have not properly arrived.

16. The method of claim 12, wherein the response time (RT) comprises a processing time τ equal to a period of time required by the other end of the communication link to determine the loss of a packet conveyed along the communication link from the first end.

17. The method of claim 12, wherein each of the plurality of packets is forwarded along the communication link at a predetermined time.

18. The method of claim 17, wherein the response time (RT) comprises a delay time τ equal to or greater than a maximum allowed accumulation delay time for the network.

19. The method of claim 12, wherein upon detecting at the other end of the communication link that a packet has not been properly received, generating at said other end at least one message to be forwarded to the first end of the communication link, wherein the at least one message provides an indication regarding the compressing device CD.sub.i located at the first end of the communication link, that should be reset.

20. The method of claim 19, wherein the compressing device $CD_i$ that should be reset is the compressing device which had forwarded the packet associated with the compressed data block $B_i$, that has not been properly received.

21. The method of claim 12, wherein providing a plurality of compressing devices at the first end of the communication link comprises providing M compressing devices, where M>N, and wherein the method further comprises:
    activating a currently non-active compressing device when one of the compressing devices $CD_i$, for i=1 to N, has to be reset; and
    compressing a next segment that would have otherwise been processed by the compressing device that has to be reset with the newly activated compressing device.

22. An apparatus for sending compressed data along a communication link in a communications network and located at one end of a communication link extending in a communications comprising:
    an input interface adapted to receive uncompressed data;
    a plurality of compressing devices CD, each compressing device configured to apply a lossless compression algorithm;
    a processor coupled to the input interface and the plurality of compressing devices, the processor configured to:
        divide received uncompressed data into a first plurality of sequential segments S of uncompressed data; and
        apply each segment $S_i$ of a first N sequential segments of the uncompressed data, for i=1 to N, from the first plurality of sequential segments S, to a respective compressing device $CD_i$, and obtain N respective compressed blocks $B_i$, each block $B_i$ including at least one packet and each block $B_i$ having a respective characteristic transmission time of $BlockDuration_i$, wherein:
        (a) the number (N) is equal to or less than the number of the plurality of compressing devices provided; and
        (b) a sum of aggregated characteristic transmission times $BlockDuration_i$, for i=1 to N, of said N blocks, is greater than a predetermined Response Time (RT), as expressed in the following mathematical relationship:

$$\sum_{i=1}^{N} BlockDuration_i > RT;$$

an output interface coupled to the plurality of compressing devices and configured to sequentially forward the obtained blocks $B_i$ along the communication link, wherein the blocks are forwarded sequentially in an order i=1 to N from their respective compressing devices $CD_i$;
    wherein the response time (RT) is an amount of time starting from when a packet of a block is sent from the first end of the communication link to when a message in response to the packet is received at that first end back from an other end of the communication link.

23. The apparatus of claim 22, wherein the processor is further configured to:
    determine a maximum size of each segment $S_i$ as a function of a bandwidth of a path on which the uncompressed data is received.

24. The apparatus of claim 22, wherein the processor is further configured to:
    determine a maximum size of each segment $S_i$ as a function of a bandwidth of the communication link on which the obtained blocks $B_i$ are forwarded.

25. The apparatus of claim 22, wherein the response time (RT) comprises a processing time τ equal to a period of time required by the other end of the communication link to determine the loss of a packet conveyed along the communication link from the first end.

26. The apparatus of claim 22, wherein the output interface is further operative to enable forwarding each of the plurality of packets along the communication link at a predetermined time.

27. The apparatus of claim 22, wherein the response time (RT) comprises a delay time τ equal to or greater than a maximum allowed accumulation delay time for the network.

28. The apparatus of claim 22, wherein:
    the plurality of compressing devices comprises M compressing devices, where M>N,
    wherein the processor is further configured to:
        activate a currently non-active compressing device when one of the compressing devices $CD_i$, for i=1 to N, has to be reset; and
        direct a next segment that would have otherwise been processed by the compressing device that has to be reset to the newly activated compressing device.

29. The method of claim 20, further comprising:
    resetting a decompressing device assigned to process the not properly received compressed data block $B_1$.

* * * * *